United States Patent [19]

Nakatsugawa

[11] Patent Number: 4,483,906
[45] Date of Patent: Nov. 20, 1984

[54] COPPER FOIL FOR A PRINTED CIRCUIT AND A METHOD FOR THE PRODUCTION THEREOF

[75] Inventor: Hiroshi Nakatsugawa, Yokohama, Japan

[73] Assignee: Furukawa Circuit Foil Co., Ltd., Tokyo, Japan

[21] Appl. No.: 476,248

[22] Filed: Mar. 18, 1983

Related U.S. Application Data

[63] Continuation of Ser. No. 244,785, Mar. 17, 1981.

[30] Foreign Application Priority Data

Apr. 8, 1980 [JP] Japan .................................. 55-45197

[51] Int. Cl.$^3$ .......................... C25D 7/06; C25D 5/48; B32B 15/01
[52] U.S. Cl. .................................... 428/607; 428/632; 428/675; 428/926; 428/935
[58] Field of Search ............... 428/629, 632, 633, 667, 428/675, 925, 935, 607, 926; 148/31.5; 174/68.5; 156/631, 632, 656, 657, 659.1, 666

[56] References Cited

U.S. PATENT DOCUMENTS

| | | | |
|---|---|---|---|
| 3,585,010 | 6/1971 | Luce et al. | 428/934 |
| 3,781,596 | 12/1973 | Galli et al. | 174/68.5 |
| 3,857,681 | 12/1974 | Yates et al. | 428/637 |
| 3,981,691 | 9/1976 | Cuneo | 174/68.5 |
| 4,088,544 | 5/1978 | Hutkin | 204/12 |
| 4,260,449 | 4/1981 | Berdan et al. | 174/68.5 |
| 4,311,768 | 1/1982 | Berdan | 428/639 |
| 4,376,154 | 3/1983 | Nakatsugawa | 428/647 |
| 4,386,139 | 5/1983 | Nakatsugawa | 428/674 |

FOREIGN PATENT DOCUMENTS

55-102288  8/1980  Japan .................................. 428/632

OTHER PUBLICATIONS

*46th Guidebook Directory for Metal Finishing*, Metals and Plastics Publications, pp. 130–133, 290, 291, (1978).
Lowerheim, F. A.; *Electroplating* McGraw Hill, pp. 80–81, (1978).
Branciaroli, J. P., et al.; "Black Chrome Plating: Application and Deposit Characteristics of a New Plating Process", *Plating*, pp. 37–43 (1/79).
"Corrosion Resistant Cobalt–Phosphorus Plating" *IBM Technical Disclosure Bulletin* vol. 8 No. 1, p. 4, Jun. 1965.

*Primary Examiner*—L. Dewayne Rutledge
*Assistant Examiner*—John J. Zimmerman
*Attorney, Agent, or Firm*—Frishauf, Holtz, Goodman & Woodward

[57] ABSTRACT

Copper foil for printed circuits which comprises a copper layer and a nickel layer formed on one or both sides of said copper layer, the surface of said nickel layer having been subjected to a cathodic chromic acid treatment, and a method for producing the same. Said copper foil can be etched easily and completely with ammonium persulfate solution or with a cupric chloride solution, and is free from so called undercutting phenomenon. A further advantage of printed circuits prepared with said copper foil is that the exposed resin substrate is not stained and the copper foil is strongly adhered to the substrate before and after heating.

2 Claims, No Drawings

COPPER FOIL FOR A PRINTED CIRCUIT AND A METHOD FOR THE PRODUCTION THEREOF

This application is a continuation, of U.S. patent application Ser. No. 244,785, filed Mar. 17, 1981.

The present invention relates to copper foil for a printed circuit and a method for the production thereof. More particularly, the present invention relates to copper foil to be used for the production of a copper-clad laminated board for a printed circuit, which comprises copper foil having a nickel layer on a copper layer (copper foil material), said nickel layer being electrolytically surface treated by connection as the cathode in a chromic acid containing solution, and a method for the production thereof.

Printed circuits are widely used in a variety of electronic application such as radios, televisions, computors, or telephone exchangers. There have recently been remarkable developments in this field and accordingly there is an increasing need for high quality boards for printed circuits.

With conventional copper-clad laminated boards for printed circuits, it frequently happens that brown stains or spots appear at the interface between the copper foil and the substrate resin layer. (The surface which is in contact with the resin layer will hereinafter be referred to as "a bonding surface of the copper foil".) Such stains impair the outer appearance of the circuit and adversely affect the dielectric properties of the resin. Further, ther has been a recent tendency that an increasing number of heat treatments at high temperatures are involved during the process for the production of boards for printed circuits, whereby the adhesion between the copper foil and the resin is likely to be deteriorate due to thermal degradation thus leading to a serious practical problem. The formation of the brown stains and the deterioration in the adhesion between the copper foil and the resin, are believed to be caused mainly by chemical reactions between the copper foil and the resin layer. However, no adequate analysis of the causes has yet been done.

The following methods have been proposed to overcome these drawbacks.

U.K. Pat. No. 1,211,494 describes a method in which 0.2 to 1.0 g/m$^2$ of nickel, cobalt, chromium or stainless steel is plated on the bonding surface of the copper foil for a printed circuit. Japanese Patent Publication No. 35711/1976 discloses a method in which at least $10.16 \times 10^{-6}$ cm (i.e., 4 microinches) of indium, zinc, tin, nickel, cobalt, a copper-zinc alloy or a copper-tin alloy is electrodeposited on the surface of copper foil. Also, Japanese Patent Publication No. 39376/1978 discloses plating zinc, brass, nickel, cobalt, chromium, cadmium, tin or bronze on the surface of copper foil. Further, Laid-open Japanese Patent Application No. 16863/1974 describes a method in which a layer of a metal which is less noble than copper, such as aluminum, chromium, manganese, iron, cobalt, nickel, zinc, cadmium, tin, lead or indium, or its alloy with copper or with other metals, such as copper-zinc, copper-cadmium, copper-tin, or tin-zinc, is formed on the surface of copper foil.

Among these metals which form a layer on a copper foil, nickel, tin, cobalt and a copper-tin alloy, have the drawback that they are hardly dissolved by an ammonium persulfate solution which is one of the etchants commonly used in the printed circuit operations.

On the other hand, in the method for plating zinc, a so-called undercutting phenomenon occurs wherein the etchant penetrates into the interface between the copper foil constituting a circuit and the resin during etching with an ammonium persulfate solution or a cupric chloride solution. Another great drawback is that there also occurs penetration of etchant between the foil constituting the circuit and the resin in the treatment with a solution containing hydrochloric acid as used in the printing circuit technique. On the other hand, in the method for plating brass (copper-zinc alloy), there is no practical method except using cyanide baths, which will cause, however, great trouble from the standpoint of the working environment as well as environmental pollution.

In the aforesaid method for plating nickel, there is also an attempt to improve the method so that the nickel layer may be etched with an ammonium persulfate solution. Laid-open U.K. patent application No. GB 2010910A discloses etching on both the copper foil and the nickel layer using the same etchant by incorporating 0.05% to 10.0% of sulfur in the nickel layer.

However, as seen from the trace experiment of the Example in said laid-open U.K. Patent Application, said nickel-plated copper foil was not sufficiently improved to the extent that it become readily etchable with an ammonium persulfate solution, and there still remains the problem that the etching performance with a cupric chloride solution is rather deteriorated.

The object of the present invention is to provide a copper foil for printed circuit in which various problems existing in the bonding surface of copper foil for printed circuit as mentioned above have been overcome, and a method for the production thereof.

The copper coil for printed circuits according to the present invention is capable of being etched easily and completely either with an ammonium persulfate solution or with a cupric chloride solution to give a clear substrate resin surface, and free from an undercutting phenomenon. Further, in the copper-clad laminated board according to this invention, a solution containing hydrochloric acid does not penetrate between the foil and the resinous substrate; generation of stains does not occur; and strong adhesion can be maintained not only before heating, and but also after heating.

Thus, the copper foil for a printed circuit according to the present invention is characterized by having a nickel layer on a copper layer (copper foil material), said nickel layer being electrolytically treated as the cathode at least on the surface on the side of the bonding surface of said nickel layer (the surface opposite to that in contact with the copper layer).

Now, the copper foil for a printed circuit according to the present invention will be described in more detail.

Copper foil for the basic copper layer may be any copper foil normally used for a printed circuit, for instance, such as electrodeposited copper foil or rolled copper foil. Further, it may be the one subjected to a surface roughening treatment such as etching by acid pickling, or a surface roughening treatment by electrodeposition as disclosed in U.S. Pat. No. 3,220,897 or 3,293,109.

The nickel layer formed on the bonding surface of the aforesaid copper foil functions to avoid generation of stains at the bonding surface, to bring about heat-resistant adhesion between the laminated resinous substrate and the foil, exhibiting no undercutting phenomenon at the time of formation of circuit by etching and being free from penetration of solution between the foil and the resinous substrate in the step using a solution containing hydrochloric acid.

Such characteristics can be achieved by coating the bonding surface of the copper foil with a nickel plated layer of which the preferred thickness is 0.002 to 0.8 $\mu$, more preferably 0.02 to 0.2 $\mu$. With a thickness less than 0.002 $\mu$, no such effect as mentioned above can be obtained. On the contrary, a thickness exceeding 0.8 $\mu$ will lower the purity of copper for use as a copper foil as well as the electrical properties of the copper foil and the roughness of the bonding surface of the foil with such a thickness of nickel plating layer is difficultly controllable. Further, such a thickness will cause additional economical disadvantages with respect to the treatment speed and the cost for plating materials.

When a printed circuit is formed by bonding the aforesaid copper foil having a nickel layer on the bonding surface to a resinous substrate, followed by etching using a ferric chloride solution or a cupric chloride solution, there can be obtained a clear substrate resin surface without any etching residue, being advantageously free from generation of stains as mentioned above. However, when there is employed an ammonium persulfate solution widely used as an etchant to remove the copper foil by etching, nickel remains as dark colored etching residue, thus failing to give a clear substrate resin surface.

The present inventors have found that the nickel surface of the aforesaid copper foil having a nickel layer on the bonding surface can be cathodically electrolyzed in a chromic acid treatment liquid to give a treated surface, of which even the nickel layer can readily and completely be dissolved away with not only a ferric chloride solution or a cupric chloride solution but also an ammonium persulfate solution, whereby there can be obtained a clear substrate resin surface without any etching residue, being also advantageously free from generation of stains as mentioned above. As additional advantages, there can be obtained improvement in resistance to thermal deterioration of the copper-clad laminated boards produced with glass-epoxy resin substrates, as well as in peel strength and soldering heat resistance of the copper-clad laminated boards produced with phenol resin substrates by using adhesives.

The chromic acid treatment liquid to be used in cathodic electrolysis according to the present invention may be inclusive of an aqueous solution of chromic acid alone, an aqueous solution of an alkali metal salt or an ammonium salt of chromic acid or dichromic acid, and an alkaline excessive aqueous solution thereof. As an alkali metal salt or an ammonium salt of chromic acid or dichromic acid, there may be mentioned, for example, sodium chromate, sodium dichromate, potassium chromate, potassium dichromate, ammonium chromate, ammonium dichromate, etc. The alkaline excessive aqueous solution refers to an aqueous solution adjusted to an alkalinity (e.g. pH=13) by addition of an alkali such as sodium hydroxide or potassium hydroxide to the above mentioned solution.

The concentration of these chromic acid, chromic acid salts or dichromic acid salts may preferably be 0.1 to 20 g/liter as chromic acid ($CrO_3$), more preferably 0.3 to 7 g/liter. With a concentration less than 0.1 g/liter, the aforesaid effect can only insufficiently be achieved, while a concentration in excess of 20 g/liter will bring about inconveniences in handling, loss of the solution material (solute) accompanying the take out of the product from the bath and difficulty in treatment of waste water.

Next, the method for production of the copper foil according to the present invention is to be described below.

Practically, it is most convenient to form the nickel layer on the copper layer by way of electroplating.

The production method according to the present invention by way of electroplating is to be described below.

In practicing the present invention by the electroplating method, the conditions such as the composition of the nickel plating bath, the bath temperature and the current density may be the same as in conventional nickel electroplating and no specific method is required therefor. As for the electroplating bath, besides the bath containing nickel sulfate as a main component as widely used in recent commercial application, there may also be employed a chloride bath, a sulfamic acid bath or others.

After plating of nickel, the copper foil is washed with water and is then immersed in the aforesaid chromic acid treatment liquid and electrolysis is effected with the nickel layer as the cathode. The electrolytic treatment may be performed either at room temperature or under heating, at a current density generally in the range from 0.3 to 10 A/dm$^2$. The electrolytic treatment is effected generally within a period from 1 to 60 seconds, as different from the chromium plating treatment wherein deposition of chromium metal will occur. After the electrolytic treatment, the treated product is washed with water and dried to give the desired copper foil of the present invention.

It has been reported in the prior art that electrolysis in a dilute aqueous chromic acid solution produces chromium oxides or hydrated oxides of chromium as deposite (Metal Surface Technology 23(9), 1972, P. 525-; ibid., 15(8) 1964, P. 303-). Hence, it is believed that such substances are deposited in minute amounts on the surface of the nickel layer in the preseht invention.

The copper foil according to the present invention having the nickel layer on the bonding surface thereof, said nickel layer being subjected to cathodic electrolysis treatment in a chromic acid treatment liquid on its surface, when used as the electroconductive element in a copper-clad laminated board for printed circuit, is found to exhibit the excellent results as mentioned below.

That is, after lamination of the copper foil on a glass-epoxy resin substrate, there was found no staining generated between the copper foil and the substrate resin layer. The peel strength was sufficiently high after lamination, indicating values which were not substantially lowered even after heating at 300° C. for 3 minutes or heating at 180° C. for 5 hours. Etching can also be successful by use of any of the etchants such as ferric chloride solution, cupric chloride solution and ammonium persulfate solution, and the portions of the copper foil at which etching is desired to be effected can readily and completely be removed. Moreover, there was observed no penetration of the etchant into the interface between the copper foil and the resinous substrate (undercutting phenomenon). Furthermore, even by the hydrochloric acid test, simulating the treatment step using a solution containing hydrochloric acid, there was no penetration of the solution into the interface between the copper foil and the resinous substrate.

When a copper foil was laminated on a polyimide substrate, there is recognized no such staining colored greenish brown, as was observed on the substrate after removal of the copper by etching according to the method of prior art, when the copper foil treated according to the present invention is used. Further, a copper foil can be laminated on a phenol resin substrate with improved peel strength, especially with a remarkable improvement when laminating a copper foil on a phenol resin type flame-retardant substrate.

As compared with a copper foil having only electroplated nickel on the bonding surface of the copper foil, the copper foil of the present invention subjected to further cathodic electrolysis treatment in a chromic acid containing solution is remarkably superior thereto in that etching with the aforesaid ammonium persulfate solution will afford easy and complete removal of the copper foil. Moreover, deterioration of peel strength of the product laminated on a glass-epoxy substrate under heating at 300° C. for 3 minutes was found to be improved to a great extent, and there were also remarkable improvements in the peel strength as well as soldering heat resistance of the copper foil laminated on a phenol resin substrate after coating and drying a phenol resinbutyral resin type adhesive were also improved.

As apparently seen from the above description, the copper foil of the present invention overcomes the drawbacks of the nickel-coated copper foil of prior art, with additional advantages in quality as well as economy such as simplification and reliability of the etching step, improvement of the quality and decrease in percentage of unacceptable products.

The production process according to the present invention is suitable for commercial production on a large scale, since it can be practiced by continuously running a copper foil material through a nickel-electroplating bath to effect plating thereon, washing with water and then running the foil through a chromic acid treatment bath in which the foil is subjected to cathodic electrolysis, followed by washing with water and drying.

The present invention will be illustrated by the following Examples, which should not be construed as limitative of the present invention.

EXAMPLE 1

With use of a solution containing 240 g of nickel sulfate (hexahydrate), 45 g of nickel chloride (hexahydrate) and 30 g of boric acid per liter of the solution and having a pH of 2.9, at 43° C., as the electrolyte, electroplating was applied to the matte side (i.e. the bonding surface) of electrodeposited copper foil having a thickness of 35 microns, at a current density of 2.2 A/dm$^2$ for 30 seconds. The amount of electrodeposition of nickel per apparent surface area of the matte surface corresponded to a thickness of about 0.2 micron and the surface presented a nickel color having no lustre. The foil was washed with water, and then with use of a solution adjusted to pH 13 by adding 3 g of chromic acid anhydride and 3.4 g of sodium hydroxide per liter of the solution at room temperature as the electrolytic bath, electrolysis was carried out at a current density of 3 A/dm$^2$ for 5 seconds with the above nickel surface as the cathode. There was observed no change in appearance after said treatment. The treated foil was washed with water, dried and thereafter laminated on a glass-epoxy substrate to form a copper-clad laminated board. The results of measurement of various properties of this board are shown in Table 1 together with those of Comparative example 1 in which a foil not subjected to the chromic acid treatment was used.

EXAMPLE 2

The same treatment as described in Example 1, except for using a solution of pH 4.2 containing 300 g of nickel sulfamate and 15 g of of ammonium sulfate per liter of the solution at 40 °C. as the electrolyte, was applied on the matte side of electrodeposited copper foil.

Then, following the procedures similar to Example 1, the properties of the resultant product were measured to obtain the results as shown in Table 1 together with those of Comparative Example 2 without treatment with chromic acid.

EXAMPLE 3

With use of a solution containing 250 g of nickel chloride (hexahydrate) and 53 g of hydrochloric acid per liter of the solution at 22° C. as the electrolyte, electroplating was effected on the matte surface of electrodeposited copper foil with a thickness of 35 microns at a current density of 2 A/dm$^2$ for 57 seconds. After washing the electroplated foil with water, electrolytic treatment was applied on the above nickel surface as the cathode at a current density of 3 A/dm$^2$ for 5 seconds, using a solution adjusted to pH 9 by addition of 1 g of chromic acid anhydride and 2.5 g of sodium hydroxide per liter of the solution at room temperature as the electrolytic bath. Then, following the procedures similar to Example 1, the properties of the product were measured to obtain the results as shown in Table 1 together with those for Comparative example 3 in which no treatment with chromic acid was conducted.

EXAMPLE 4

The same treatment as described in Example 3 was applied on the matte surface of electrodeposited copper foil, except that there was employed a solution containing 1 g of chromic acid anhydride as the chromic acid solution at 50° C. as the electrolytic bath and the electrolytic treatment was conducted under the conditions of a current density of 3 A/dm$^2$ for 5 seconds.

The properties of the product were determined similarly as in Example 1 to obtain the results as shown in Table 1.

EXAMPLE 5

The treatment was conducted in the same manner as in Example 1, except that there was employed a solution containing 5 g/l of sodium chromate as the chromic acid treatment solution and the cathodic chromic acid treatment was conducted at a current density of 3 A/dm$^2$ for 5 seconds. There was no change in appearance after said treatment.

After washing with water drying, the thus treated foil was laminated on a glass-epoxy substrate to provide a copper-clad laminated board, of which properties were measured to give the results as shown in Table 1.

EXAMPLE 6

The same treatment as in Example 1 was conducted except that the cathodic chromic acid treatment was effected at a current density of 3 A/dm$^2$ for 5 seconds at room temperature, using a solution containing 4.5 g/liter of potassium dichromate as the chromic acid treatment solution. There was observed no change in appearance as the result of said treatment.

The thus treated foil was washed with water and dried, and then laminated on a glass-epoxy substrate to provide a copper-clad laminated board. The properties of the board were measured to give the results as shown in Table 1.

EXAMPLE 7

The treatment was conducted in the same manner as in Example 3 except that the cathodic chromic acid treatment was effected at a current density of 3 A/dm$^2$ for 5 seconds at room temperature, using a solution containing 5 g/liter of sodium chromate as the chromic acid treatment solution. There was no change in appearance by the treatment.

The treated foil, after washing with water and drying, was laminated on a glass-epoxy substrate to provide a copper-clad laminated board. The properties of this board were measured to obtain the results as shown in Table 1.

Example 8

Example 3 was repeated except that the cathodic chromic acid treatment was effected at a current density of 3 A/dm$^2$ for 5 seconds at room temperature, using a solution containing 4.5 g/liter of sodium dichromate as the chromic acid treatment solution. There was no change in appearance by the treatment.

After washing with water and drying, the treated foil was laminated on a glass-epoxy substrate to provide a copper-clad laminated board. The properties of the board were measured to give the results as shown in Table 1.

TABLE 1

|  | Etching residue | | Peel strength of copper foil laminated on a glass-epoxy substrate* (Kg/cm) | |
|---|---|---|---|---|
|  | Etching condition A | Etching condition B | No heat treatment after lamination | After heating at 300° C. for 3 minutes after lamination |
| Example 1 | None | None | 2.06 | 2.05 |
| Example 2 | ......do | ......do | 2.01 | 1.88 |
| Example 3 | ......do | ......do | 2.10 | 1.96 |
| Example 4 | ......do | ......do | 2.18 | 2.07 |
| Example 5 | ......do | ......do | 2.13 | 1.85 |
| Example 6 | ......do | ......do | 2.04 | 1.93 |
| Example 7 | ......do | ......do | 2.02 | 1.90 |
| Example 8 | ......do | ......do | 2.15 | 2.02 |
| Comparative example 1 | ......do | Much | 2.05 | 1.30 |
| Comparative example 2 | ......do | ......do | 2.04 | 1.28 |
| Comparative example 3 | ......do | ......do | 2.20 | 1.20 |

Etching condition A: Using an etching solution containing 200 g/l of CuCl$_2$·2H$_2$O, 150 g/l of HCl, etching was performed at 45° C. for 15 minutes.
Etching condition B: Using an etching solution containing 250 g/l of (NH$_4$)$_2$S$_2$O$_8$, 50 g/l of H$_3$PO$_4$, etching was performed at 45° C. for 13 minutes.
* Peel strength test: JIS C 6481-1976, Paragraphs 5-7.

I claim:

1. An improved composite copper foil useful in the manufacture of printed circuits comprising a copper foil layer and at least one nickel layer which is substantially sulfur-free, said nickel layer being integral with and coating at least one surface of said copper foil, the improvement comprising said composite copper foil coated with said nickel layer having been immersed in and said nickel layer cathodically electrolized in a chromic acid bath to treat the surface of said nickel layer so that said composite foil becomes readily and completely removable by etching in ammonium persulfate etchant, said chromic acid bath consisting essentially of an aqueous solution of chromic acid or an aqueous solution of an alkali metal salt or an ammonium salt of chromic acid or dichromic acid, and said nickel foil having a thickness of from 0.002 to 0.8 micron prior to having been immersed in said chromic acid bath.

2. The copper foil of claim 1 wherein said nickel layer prior to said immersion has a thickness of from 0.02 to 0.2 micron.